(12) United States Patent
Kitou (10) Patent No.: US 7,542,320 B2
(45) Date of Patent: Jun. 2, 2009

(54) SEMICONDUCTOR MEMORY DEVICE

(75) Inventor: Ryoutaka Kitou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 330 days.

(21) Appl. No.: 11/623,649

(22) Filed: Jan. 16, 2007

(65) Prior Publication Data

US 2007/0171701 A1 Jul. 26, 2007

(30) Foreign Application Priority Data

Jan. 16, 2006 (JP) ............................. 2006-007106

(51) Int. Cl.
*G11C 5/02* (2006.01)

(52) U.S. Cl. ..................... 365/51; 365/230.03; 257/296

(58) Field of Classification Search ................... 365/51, 365/230.03; 257/296
See application file for complete search history.

(56) References Cited

U.S. PATENT DOCUMENTS 7,242,602 B2 *  7/2007  Lee et al. ...................... 365/69

FOREIGN PATENT DOCUMENTS

JP         6-151782 A       5/1994

* cited by examiner

*Primary Examiner*—Son Dinh
*Assistant Examiner*—Nam Nguyen
(74) *Attorney, Agent, or Firm*—Sughrue Mion, PLLC (57) ABSTRACT

A semiconductor memory device includes a plurality of word lines arranged above a semiconductor substrate to extend in a row direction; a plurality of digit lines arranged above the semiconductor substrate to extend in a column direction orthogonal to the row direction; a power supply line arranged in parallel to the plurality of digit lines; a plurality of memory cells formed on the semiconductor substrate at intersections of the plurality of word lines and the plurality of digit lines, each of the plurality of memory cells having a drain region and a source region; and a linear conductive section arranged under the power supply line. The power supply line is connected with the linear conductive section which is connected with the source regions of the plurality of memory cells. The drain regions of each of columns of the plurality of memory cells are connected with one of the plurality of digit lines, and the plurality of word lines function as gates of the plurality of memory cells.

14 Claims, 12 Drawing Sheets

SEMICONDUCTOR MEMORY DEVICE

BACKGROUND OF THE INVENTION

1. Field of the Invention

The present invention relates to a semiconductor memory devices

2. Description of the Related Art

Figure 1:
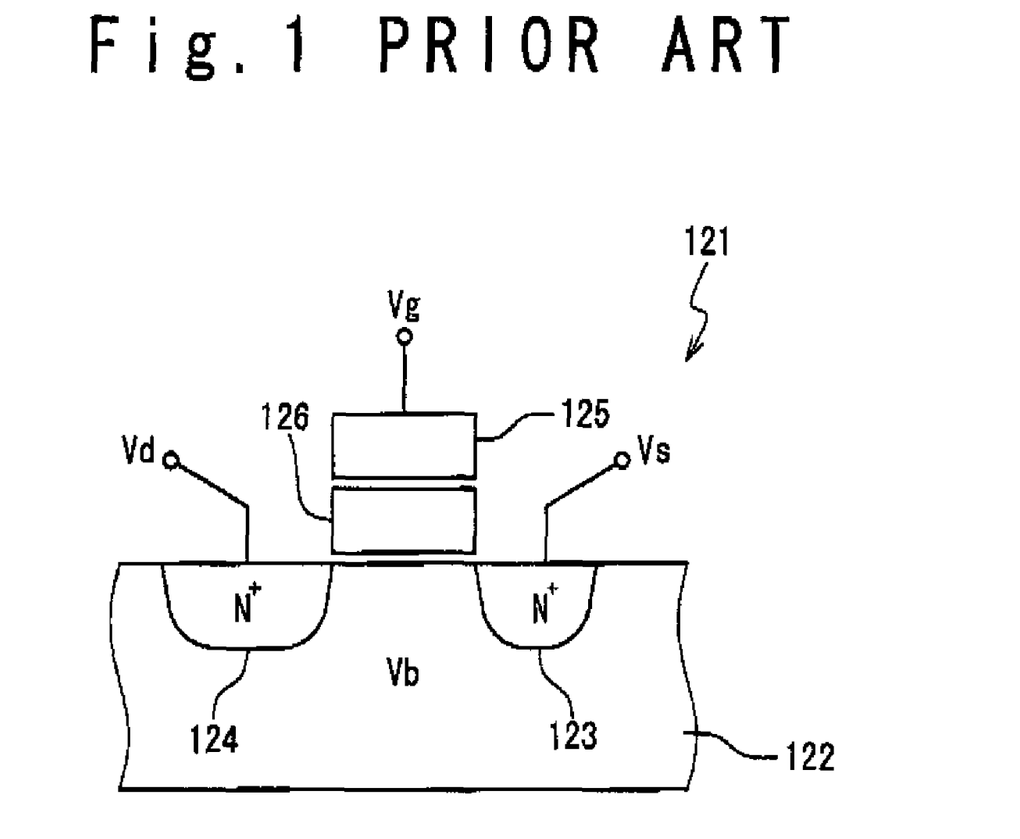
FIG. 1 is a sectional view showing the configuration of a typical nonvolatile memory cell.

In accompaniment with the advancement of a semiconductor technique, semiconductor memory devices have been installed in various electronic equipments. In particular, the demand for a nonvolatile semiconductor memory device has been increased year by year. As the nonvolatile semiconductor memory device that is currently generally spread, EEPROM, a Flash Memory registered trademark) and the like are exemplified. FIG. 1 is a sectional view showing the configuration of a typical nonvolatile semiconductor memory device. With reference to FIG. 1, a memory cell 121 is provided with a substrate 122, a floating gate 126 and a control gate 125. Also, as shown in FIG. 1, a source diffusion region 123 and a drain diffusion region 124 are formed in the substrate 122. In an operation of the nonvolatile semiconductor memory device, a gate voltage Vg to be applied to the control gate 125, a source voltage Vs to be applied to the source diffusion region 123, and a drain voltage Vd to be applied to the drain diffusion region 124 are changed for each of the plurality of memory cells 121 to control the charge amount in the floating gate 126. A charge (hot electron) amount stored in the floating gate 126 of the memory cell 121 is changed to vary a threshold or a memory cell transistor. In short, the memory cell transistor in which hot electrons have been injected into the floating gate 126 has a high operation threshold, and the memory cell transistor in which the hot electrons are not injected has a low operation threshold. In the nonvolatile semiconductor memory device, each of the thresholds of the plurality of memory cell transistors is controlled to store a data.

Figure 2:
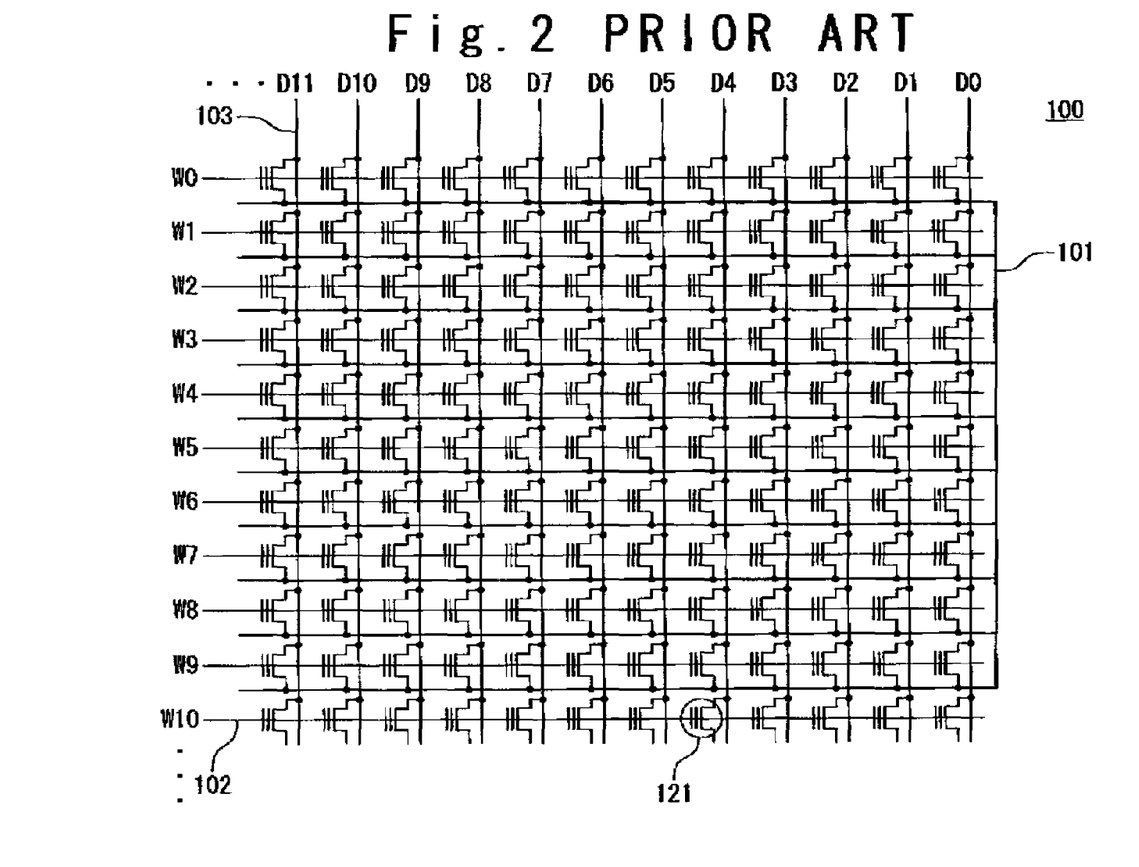
FIG. 2 is a circuit diagram showing the configuration of memory cells in a conventional NOR type flash memory.

FIG. 2 is a circuit diagram showing the configuration of a memory cell array in a NOR type flash memory 100 as the conventional nonvolatile semiconductor memory device. Referring to FIG. 2, the NOR type flash memory 100 is provided with memory cells 121 arranged in a matrix, a power supply wiring line 101 for supplying power to each of the memory cells 121, a plurality of word lines W0 to Wn 102 formed in a row direction, and a plurality of digit lines D0 to Dn 103 formed in a column direction, As shown in FIG. 2, the power supply line 101 supplies a common power supply voltage to the respective memory cells 121. In read, write and erasure of the data in the NOR type flash memory 100, a word voltage is selectively supplied to one of the word lines W0 to Wn and also a digit voltage is selectively supplied to one of the digit lines D0 to Dm.

Figure 3:
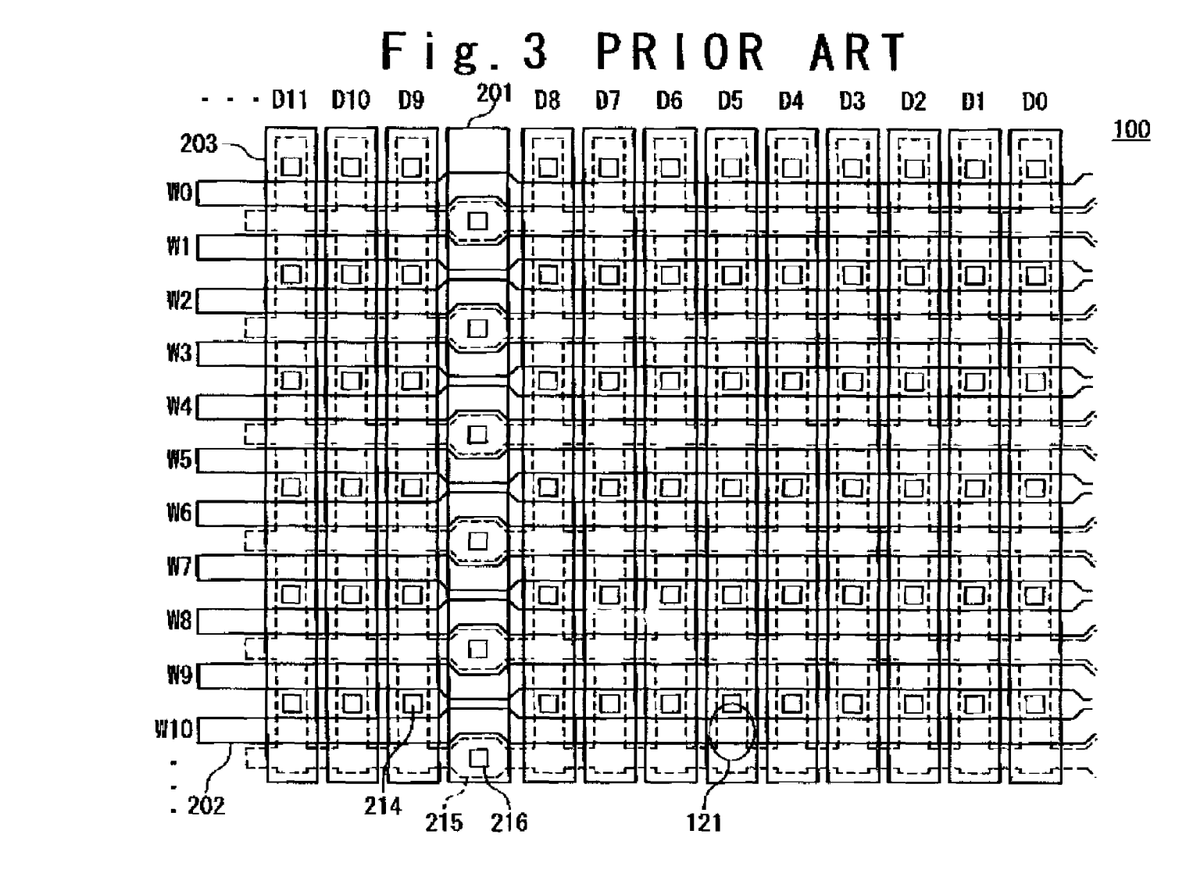
FIG. 3 is a diagram showing a layout pattern of the memory cells in the conventional NOR type flash memory shown in FIG. 2.

In the above circuit configuration, the power supply line 101 is arranged between the two of the memory cells 121 in the conventional NOR type flash memory 100 to supply the common power supply voltage to the respective memory cells 121. FIG. 3 is a diagram showing a layout pattern of the memory array in the conventional NOR type flash memory 100, and the layout pattern corresponds to the circuit configuration shown in FIG. 2. As shown in FIG. 3, a power supply line pattern 201 and a group of digit line patterns 203 are formed to extend in a column direction. A group of word line patterns 202 is formed in a layer different from the group of digit line patterns 203 to extend in a row direction. The power supply line pattern 201 is connected through contacts 216 to a diffusion region 215 as the above-mentioned source diffusion region 123. The digit line patterns 203 are connected through contacts 214 to the diffusion region 215 as the above-mentioned drain diffusion region 124. The word line patterns 202 function as the control gates 125 to supply the word voltage to the control gates 125 of the memory cells 121.

Figure 4:
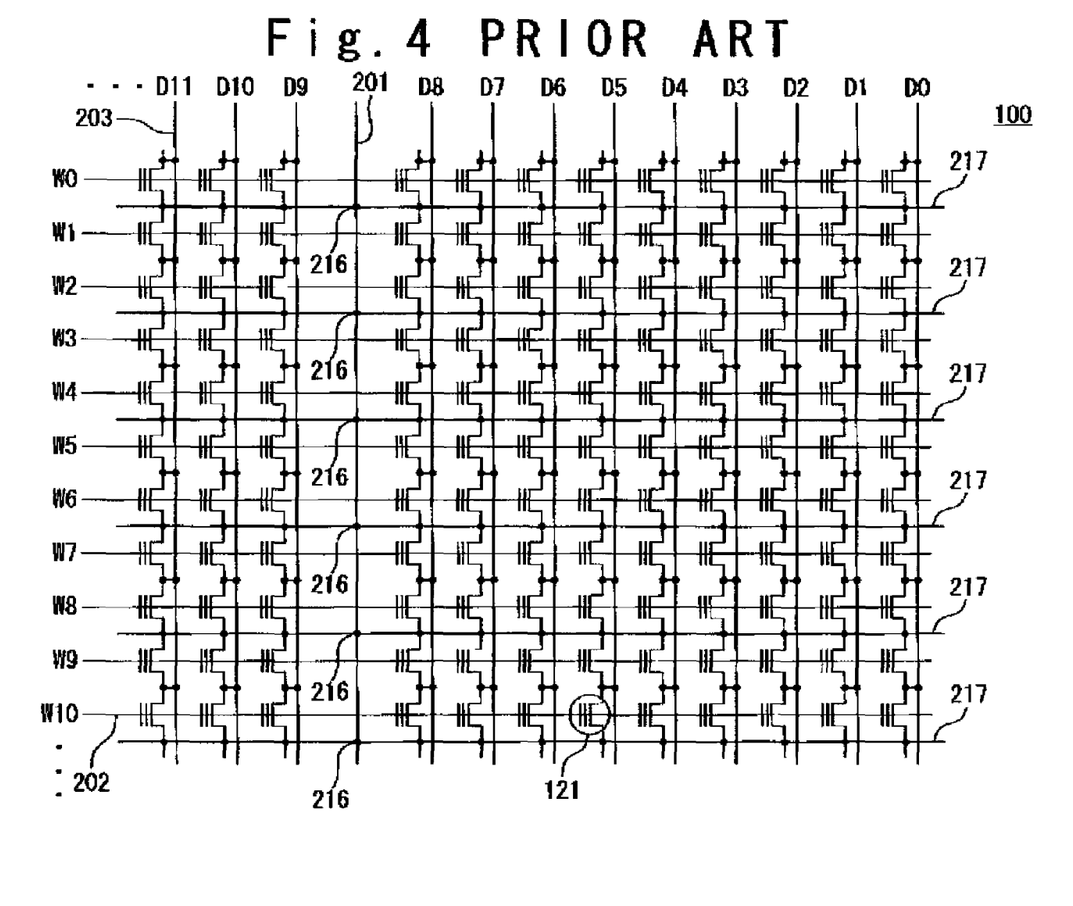
FIG. 4 is a circuit diagram showing the configuration of memory cells when the layout pattern shown in FIG. 3 is represented by circuit symbols.

FIG. 4 is a circuit diagram when the layout pattern shown in FIG. 3 is represented by circuit symbols. Here, the circuit shown in FIG. 4 is equivalent to the circuit shown in FIG. 2. With reference to FIG. 4, the plurality of memory cells 121 are arranged to oppose to each other with respect to a corresponding one of the plurality of source lines 217 extending in the row direction. Also, each of the plurality of source lines 217 is connected through the contact 216 to the power supply line pattern 201.

Figure 5:
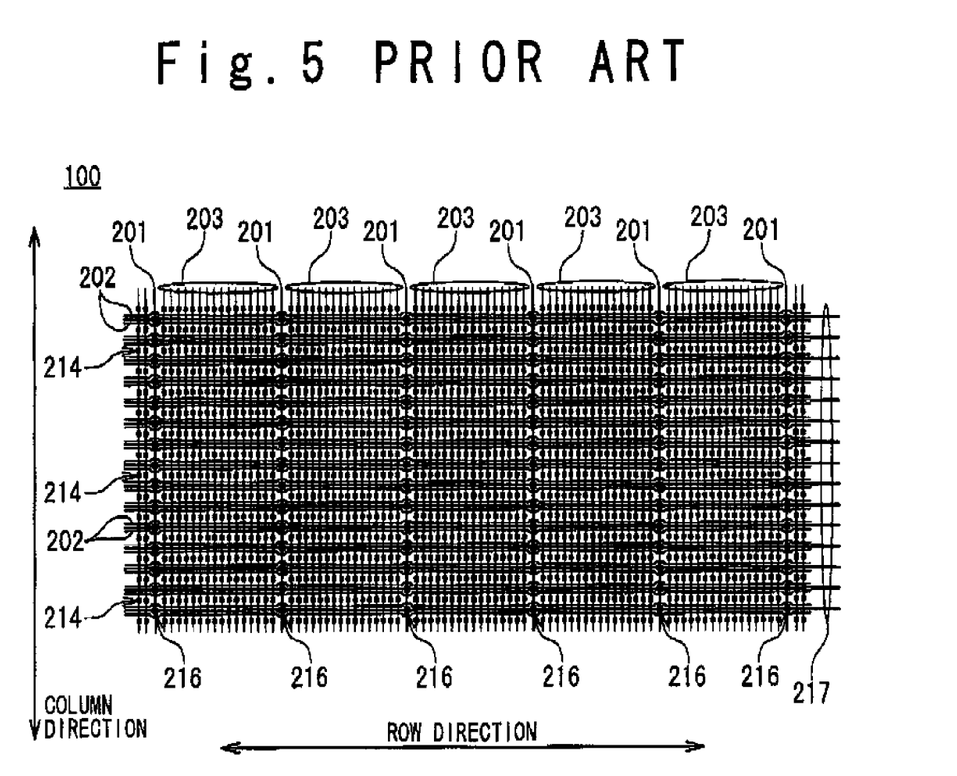
FIG. 5 is a circuit diagram showing a relation between digit line pattern lines and power supply line patterns in the conventional NOR type flash memory shown in FIG. 2.

FIG. 5 is a circuit diagram showing a relationship between the groups of digit line patterns 203 and the power supply line patterns 201 in the above layout. As shown in FIG. 5, one of the power supply line patterns 201 in the NOR type flash memory 100 is arranged for each of the groups of digit line patterns 203 extending in the column direction. The power supply voltage is supplied through the source lines 217 extending in the row direction to each of the plurality of memory cells 121. The power supply line patterns 201 and the source lines 217 are arranged in a lattice manner, and the contacts 216 are positioned at intersections between the power supply line patterns 201 and the source lines 217.

Figure 6:
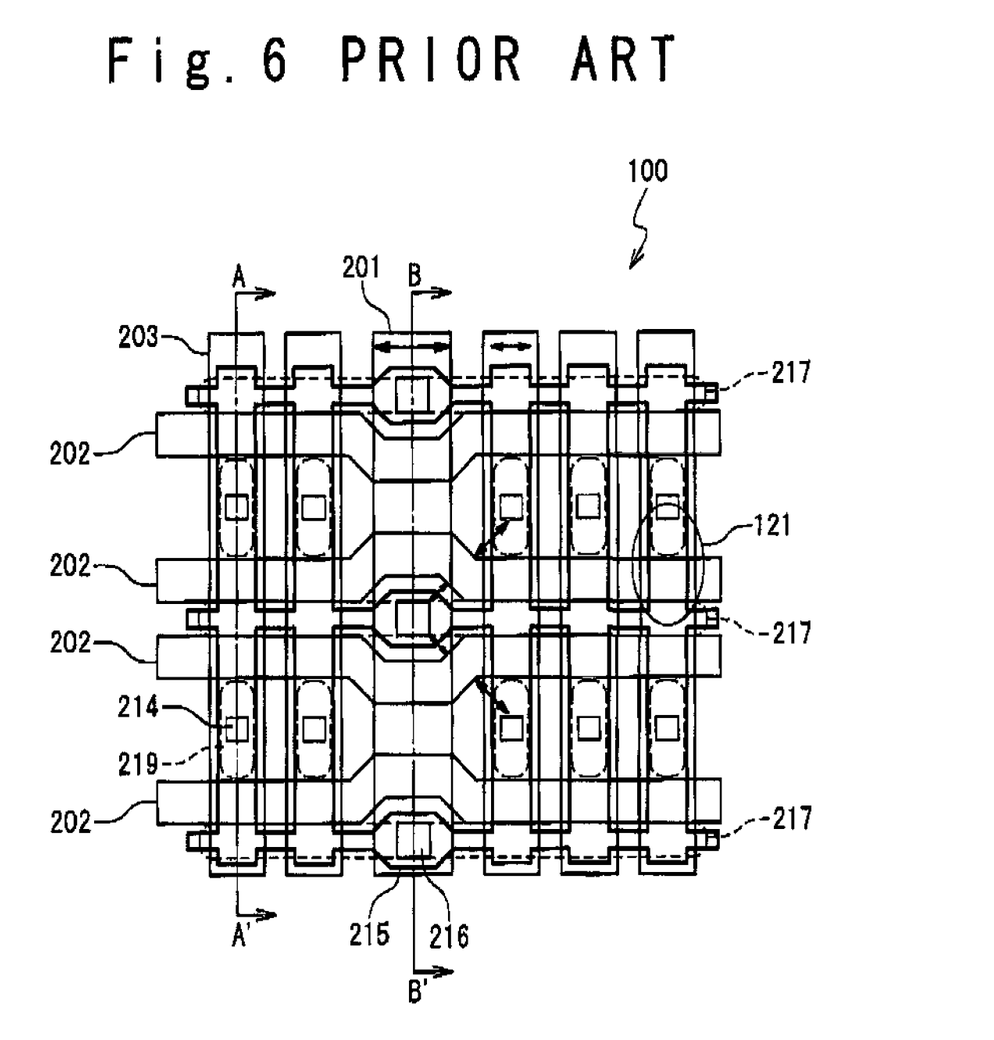
FIG. 6 is a layout showing a layout pattern of memory cells in the conventional NOR type flash memory shown in FIG. 2.

FIG. 6 is an expanded diagram showing a predetermined region in FIG. 5. With reference to FIG. 6, the conventional NOR type flash memory 100 contains the contact 216 for connecting the source line 217 and the power supply line pattern 201, and the contact 214 for connecting the diffusion region and the digit line pattern 203. The contacts 214 contained in the group of digit line patterns 203 are arranged on lines extending in the row direction. The contacts 216 are arranged on lines which do not overlap the above lines, Also, the power supply line pattern 201 is located in an upper layer than a wiring layer for the word line patterns 202. Thus, in order to prevent intersection of the word line patterns 202 and the contacts 216 and to suppress the increase in the circuit area in the column direction, the word line pattern 202 is obliquely bent in the vicinity of the contacts 216. Consequently, in the conventional NOR type flash memory 100, the interval between the contact and the control gate is secured.

Figure 7A:
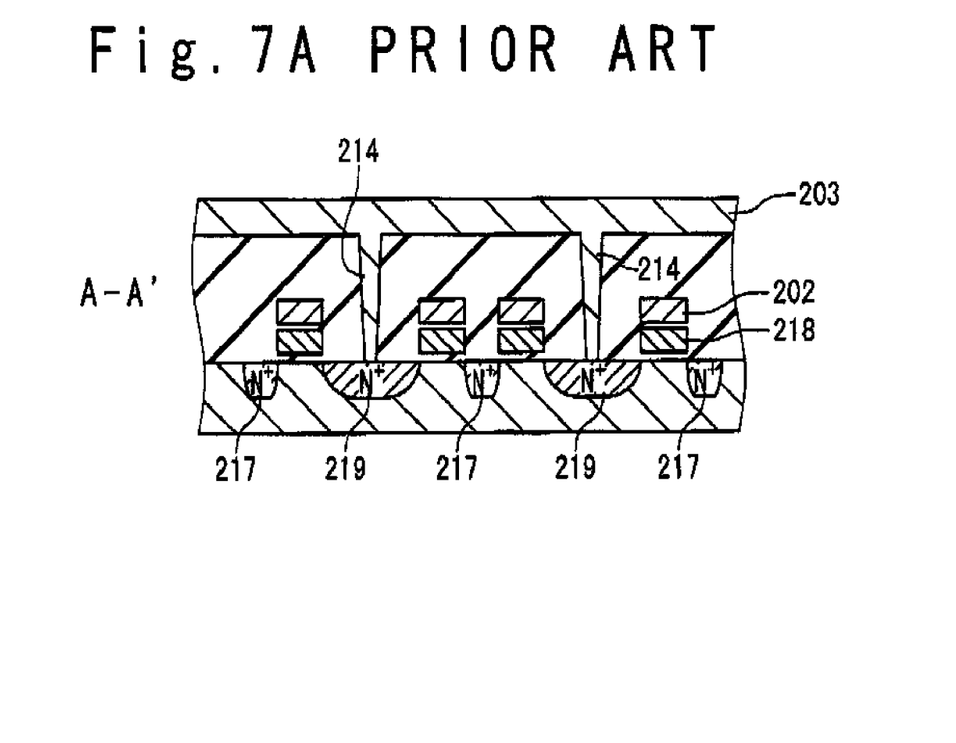
FIG. 7A is a sectional views showing a section structure of the conventional NOR type flash memory along the line A-A' shown in FIG. 6.
Figure 7B:
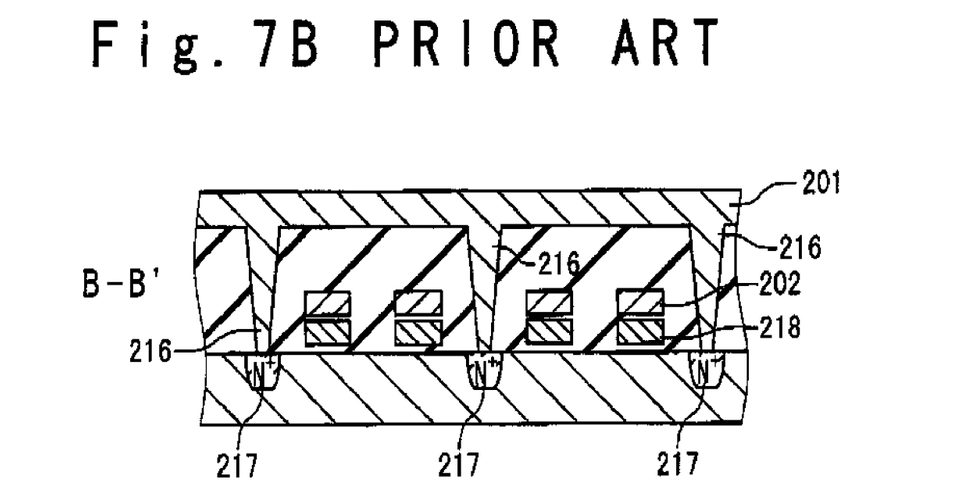
FIG. 7B is a sectional views showing a section structure of the conventional NOR type flash memory along the line B-B' shown in FIG. 6.

FIGS. 7A and 7B are sectional views showing the section structure of the NOR type flash memory 100 in the Layout pattern of FIG. 6. FIG. 7A shows the section structure of the flash memory 100 along the line A-A' in FIG. 6, and FIG. 7B shows the section structure of the flash memory 100 along B-B' in FIG. 6. Referring to FIG. 7A, the memory cell 121 has the source line (diffusion region) 217, the digit line (diffusion region) 219, a floating gate 218 and the control gate as the word line pattern 202, As shown in FIG. 7A, the digit voltage is applied from the digit line pattern 203 to the digit line (diffusion region) 219 through the contact 214. Also, the power supply voltage is applied from the power supply line pattern 201 to the source line (diffusion region) 217 through the contact 216.

In the NOR type flash memory, in order to supply the power supply voltage to each memory cell 121, the contacts 216 are arranged on the source lines 217. This contact 216 connects the power supply line pattern 201 in the upper layer than the word line pattern 202 and the diffusion region for the source line 217 in the substrate. Thus, in order to prevent any intersection between the word line pastern 202 and the contact 216, an interval of a certain length or more is required to be secure in the column direction. Also, the control gates are arranged in a predetermined interval, in an area where the contacts 216 are not formed.

As mentioned above, in the conventional NOR type flash memory 100, reduction of the chip area in the column direction is achieved by bending the word line pattern 202 obliquely. In this case, in the conventional NOR type flash memory 100, the width of the power supply line pattern 201 in the row direction is made wider than the width of the digit line pattern 203.

Figure 8:
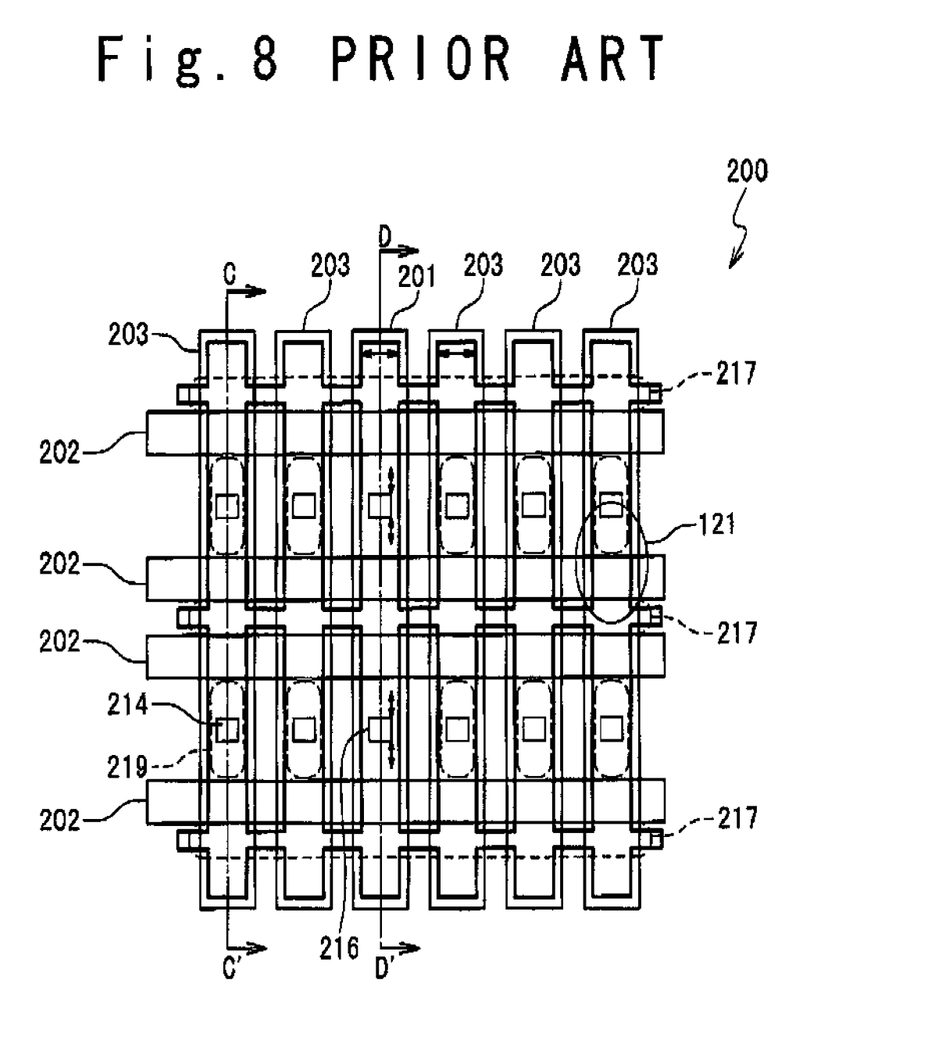
FIG. 8 is a layout showing a layout pattern of memory cells in another conventional NOR type flash memory.

A technique for preventing the word line pattern 202 from being bent so that the increase in the chip area can be suppressed is known in Japanese Laid Open Patent Application (JP-A-Heisei 6-151782). FIG. 8 is a diagram showing a layout pattern of a NOR type flash memory 200 with the above technique employed. Referring to FIG. 8, the NOR type flash memory 200 is provided with the group of digit line patterns 203 extending in the column direction, and the power supply line pattern 201 extending in parallel to the digit line patterns 203. The NOR type flash memory 200 contains the plurality of contacts 214. Through the plurality of contacts 214, the digit line patterns 203 and the drain diffusion regions 124 are connected. The contacts 214 are arranged on a line extending in the row direction. Also, the NOR type flash memory 100 contains the contacts 216. Through the contact 216, the power supply line pattern 201 and the source diffusion regions 123 are connected. The contacts 216 are arranged on the above line on which the contacts 214 are arranged.

Figure 9A:
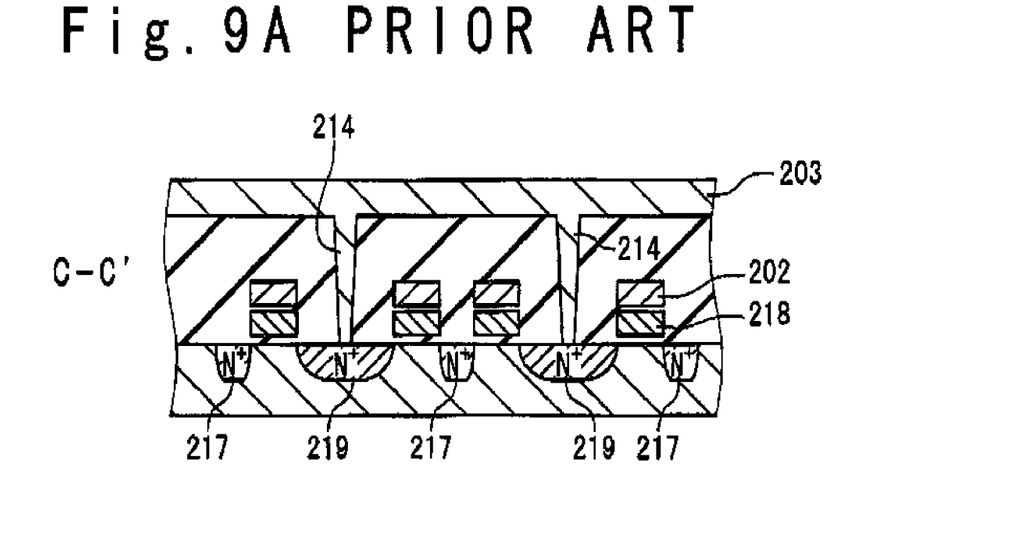
FIG. 9A is a sectional views showing a section structure of the other conventional NOR type flash memory along the line C-C' shown in FIG. 8.
Figure 9B:
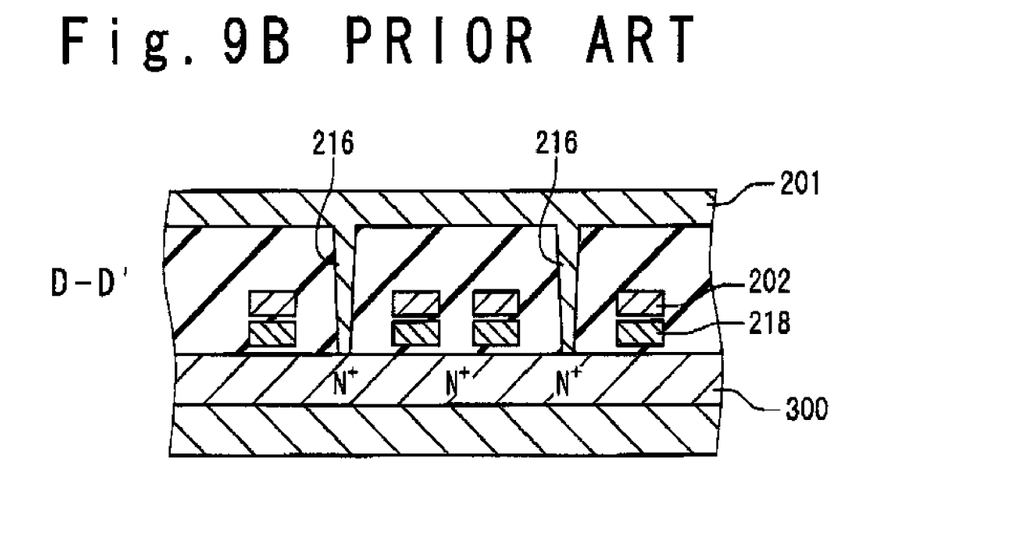
FIG. 9B is a sectional views showing a section structure of the other conventional NOR type flash memory along the line D-D' shown in FIG. 8.

FIGS. 9A and 9B are sectional views showing the section structures of the NOR type flash memory 200 shown in FIG. 8. FIG. 9A shows the section of the flash memory 200 along the line C-C' in FIG. 8, and FIG. 9B shows the section of the flash memory 200 along the line D-D' shown in FIG. 8.

In order to form the contact 216 and the contact 214 on the same line, an N+ diffusion region 300 is formed below the word line patterns 202 before the word line patterns 202 are formed. Then, through the contact 216, the power supply line pattern 201 and the N+ diffusion region 300 are connected. Consequently, the contact 216 can be arranged on the same line as the contacts 214. As shown in FIG. 9B, the application of the power supply voltage to the source line 217 is carried out through the N+ diffusion region 300.

In the present memory cell array as shown in FIG. 6, the word line patterns 202 are obliquely bent in the neighborhood of the contact 216 to reduce the chip area in the column direction. At this time, as mentioned above, the interval between the word line pattern 202 and the contact 216 needs to be set to a certain length or more. In order to secure the interval, the width of the power supply line pattern 201 is set to be thicker than the width of the digit line pattern 203 in the structure of the current memory cell array.

If the power supply line pattern 201 is set to the same width as the digit line pattern 203, it is necessary to bend the word line pattern 202 on the digit line patterns 203 adjacent to the contact 216. Also, it is difficult to prevent contact of the word line pattern 202 with the contact 214. Also, if the word line pattern 202 is not bent, the chip area in the column direction of the memory cell array becomes extremely large.

If a reticle having the line patterns whose widths are different is used, there is a case that an optical diffraction is caused so that variation in the width of a diffusion region is generated between the digit line pattern close to the power supply line and the digit line away from it. The variation in the width of a diffusion region causes the variation even in the memory cell characteristics, such as a write time, an erasure time, a threshold in reading, and a breakdown voltage, between the memory cell 121 on the digit line close to the power supply line pattern 201 and the memory cell 121 on the digit line away from the power supply line pattern 201. Finally, there is a case that the performance of the entire memory cell array is reduced.

For this reason, when the present memory cell array is configured, an optical correction for adjusting the width of each digit line on a mask in advance is carried out in order to uniformly form the respective digit lines. However, even if this optical correction is carried out, there is a case that the optical diffraction causes the variation of the cell characteristics. Also, since the power supply line pattern is wide, the chip area of the memory cell array in the row direction is also increased.

Also, when an accurate pattern is carved on a wafer surface, DOF (Depth of Focus) at a time of exposure is preferred to be a certain depth or more. At present, an exposing method having a high resolution is used in association with the fine semiconductor process. In the exposure of the high resolution that is typically used in the current semiconductor manufacture, the DOF becomes deep if a pattern density is high. However, in case of a low density, there is a case that the DOF becomes shallow. With reference to FIG. 6, when the pattern density of the digit voltage supply contact 214 and the pattern density of the power supply voltage supply contact 216 are compared, the density of the pattern where the power supply voltage supply contact 216 is contained is indicated to be lower. Thus, in order to form the contacts 216 in the low density so as to be effective, the contact 216 needs to have the margin of a certain value or more and to cope with the DOF of the shallow depth.

In the technique shown in FIG. 8, as mentioned above, impurity is implanted below the word line pattern 202 in advance to from the N+ diffusion region 300. The contact 216 which is formed on the same line as the contact 214 can connect the power supply line pattern 201 and the N+ diffusion region 300. In other words, in the technique shown in FIG. 8, the power supply voltage is applied through the N+ diffusion region 300 to the source line 217. However, the impurity is implanted below the word line pattern 202 by using a mask before the formation of the word line pattern 202 to form the N+ diffusion region 300. When the N+ diffusion region 300 is formed, the impurity needs to be implanted below the word line pattern 202. However, the impurity must not be implanted into the adjacent digit line diffusion regions. For this reason, the mask to form the source diffusion regions needs to have a margin of a certain value or more. Thus, in the technique shown in FIG. 8, it is difficult to reduce the chip area between the source line diffusion region and the digit line diffusion region.

SUMMARY OF THE INVENTION

In an aspect of the present invention, a semiconductor memory device includes a plurality of word lines arranged above a semiconductor substrate to extend in a row direction; a plurality of digit lines arranged above the semiconductor substrate to extend in a column direction orthogonal to the row direction; a power supply line arranged in parallel to the plurality of digit lines; a plurality of memory cells formed on the semiconductor substrate at intersections of the plurality of word lines and the plurality of digit lines, each of the plurality of memory cells having a drain region and a source region; and a linear conductive section arranged under the power supply line. The power supply line is connected with the linear conductive section which is connected with the source regions of the plurality of memory cells. The drain regions of each of columns of the plurality of memory cells are connected with one of the plurality of digit lines, and the plurality of word lines function as gates of the plurality of memory cells.

Here, the plurality of digit lines and the power supply line may be formed in a first wiring layer.

Also, the plurality of word lines may be formed in a second wiring layer under the first wiring layer.

Also, each of the plurality of memory cells may have a control gate and a floating gate, and the linear conductive section may be formed on the semiconductor substrate through a first insulating film in a same third wiring layer as the floating gate.

Also, the semiconductor memory device may further include a first contact configured to connect the power supply line with the linear conductive section which is connected with the source regions of the plurality of memory cells; and a second contact provided for every adjacent two of the plurality of memory cells in the column direction such that the drains regions of each of columns of the plurality of memory cells are connected with one of the plurality of digit lines. A row of the second contacts and the first contact may be arranged on a same line.

Also, the semiconductor memory device may further include a third contact provided for every two rows of the source regions of the plurality of memory cells to connect the linear conductive section with the two rows of the source regions of the plurality of memory cells.

Also, the third contact may be arranged on a side opposite to the first contact with respect to one of the plurality of word line.

In another aspect of the present invention, a semiconductor memory device includes a plurality of memory cells, each of which has a control gate and a floating gate; a plurality of digit lines arranged above the plurality of memory cells to extend in a first direction, wherein each of the plurality of digit lines supplies a digit voltage to a column of the plurality of memory cells through digit line contacts; a power supply line arranged in parallel to the plurality of digit lines; and a conductive section formed in a same wiring layer as the floating gate to supply a power supply voltage from the power supply line to power supply terminals of the plurality of memory cells through power supply line contacts.

Here, each row of the digit line contacts and one of the power supply line contacts may be formed on a same line.

Also, the conductive section may be formed under the power supply line, and may include a linear conductive section arranged to extend in the first direction; and a connection contact connecting the linear conductive section with the power supply terminals of the plurality of memory cells. The power supply line contact desirably connects the power supply line and the linear conductive section.

Also, the semiconductor memory device may further include a semiconductor substrate; an insulating film formed on the substrate; and an intergate insulating film formed between the floating gate and the control gate. Each of the plurality of memory cells may have first and second diffusion regions formed in the semiconductor substrate, the first diffusion region functions as the power supply terminal. The plurality of digit lines and the power supply line may be arranged in a same wiring layer to extend in the first direction. The plurality of control gates may be formed as a plurality of word lines extending in a second direction orthogonal to the first direction. Each of the digit line contacts may connect a corresponding one of the plurality of digit lines and the second diffusion regions of corresponding one of columns of the plurality of memory cells. The conductive section may include a linear conductive section formed in parallel to the power supply line; and a connection contact formed to connect the linear conductive section and the first diffusion regions of the plurality of memory cells. The power supply line contact may be formed to connect the power supply line and the linear conductive section.

Also, a part of the plurality of digit contacts and the power supply line contact may be formed on a same line.

DESCRIPTION OF THE PREFERRED EMBODIMENTS

Hereinafter, a nonvolatile semiconductor memory device of the present invention will be described in detail with reference to the attached drawings. Here, In an NOR type flash memory 1 to which the present invention is applied, it is assumed that a plurality of memory cells 21 are arranged in a matrix. Specifically, in the following description, the NOR type flash memory 1, each of the memory cells on a word line has a structure having an individual digit voltage. It should be noted that this configuration does not limit to the arrangement of the memory cells 21 in the present invention. Moreover, in the following embodiment, it is assumed that the memory cell 21 has the same structure as shown in FIG. 1.

Figure 10:
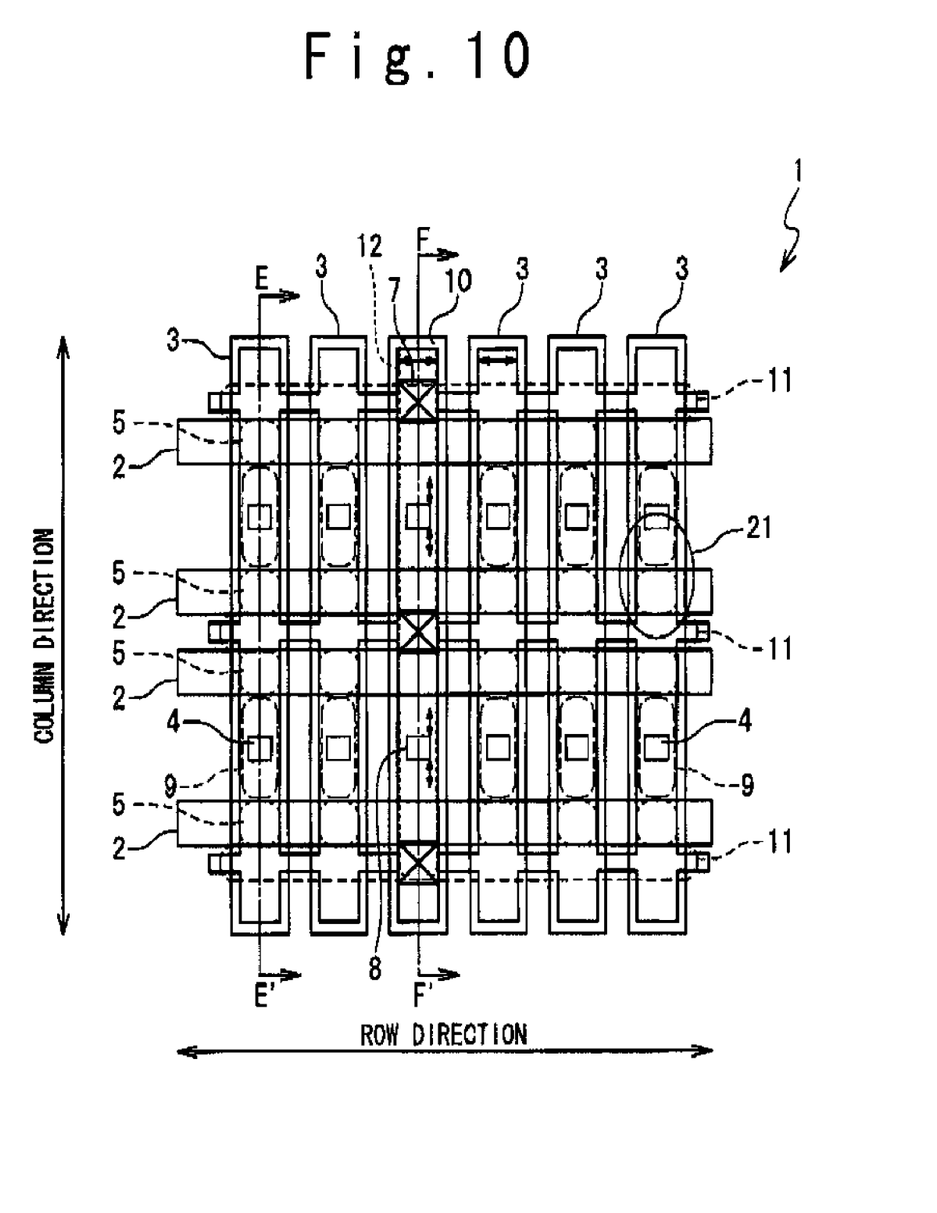
FIG. 10 is a diagram showing a layout pattern of a NOR type flash memory according to an embodiment of the present invention.

FIG. 10 is a diagram showing a layout pattern of the NOR type flash memory 1 according to the present invention. Referring to FIG. 10, the NOR type flash memory 1 in this embodiment is provided with a plurality of digit lines 3 extending in a column direction, and at least one power supply line 10 arranged in parallel to the digit lines 3. The digit lines 3 and the power supply line 10 are configured in a same layer. The lower layer than the layer for the digit lines 3 contains a plurality of control gates (word lines) 2 extending in a row direction.

The power supply line 10 of the NOR type flash memory 1 supplies a common power supply voltage to the plurality of memory cells 21. Also, in the NOR type flash memory 1, the plurality of control gates 2 function as word lines W0 to Wn, and the plurality of digit lines 3 are constituted as digit lines D1 to Dm. The NOR type flash memory 1 selectively supplies a word voltage to a selected one of the word lines and also selectively supplies a digit voltage to a selected one of the digit lines. Thus, data is written, read out and erased.

As shown in FIG. 10, the digit line 3 is connected to contacts 4, and a digit voltage is supplied through the contact 4 to a digit line diffusion region 9. Also, the control gate 2 is formed on a floating gate 5 through an interlayer insulating film. Also, a channel region is formed below the floating gate 5 through an insulating film.

A conductive section 12 is formed below the power supply line 10, and the conductive section 12 is formed in a same layer as the floating gate 5. As shown in FIG. 10, the power supply line 10 is connected to a contact 8, and the power supply voltage is supplied through the contact 8 to the conductive section 12. The conductive section 12 contains source portion contacts 7, and the power supply voltage is supplied through the source portion contacts 7 to the source line diffusion region 11, The source line diffusion region 11 functions as a source region of the memory cell 21, and the digit line diffusion region 9 functions as a drain region of the memory cell 21.

Figure 11A:
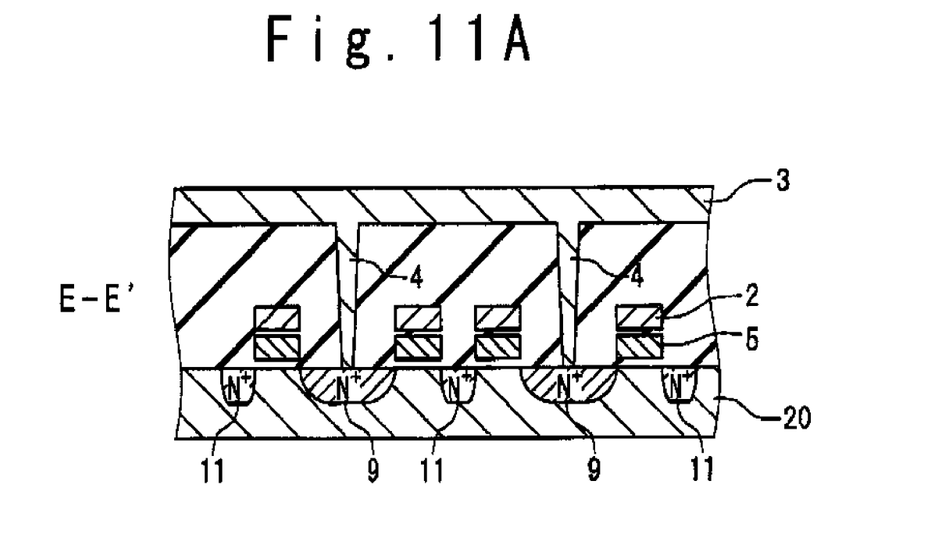
FIG. 11A is a sectional views showing a section structure of the NOR type flash memory according to the embodiment of the present invention long the line E-E' shown in FIG. 10.
Figure 11B:
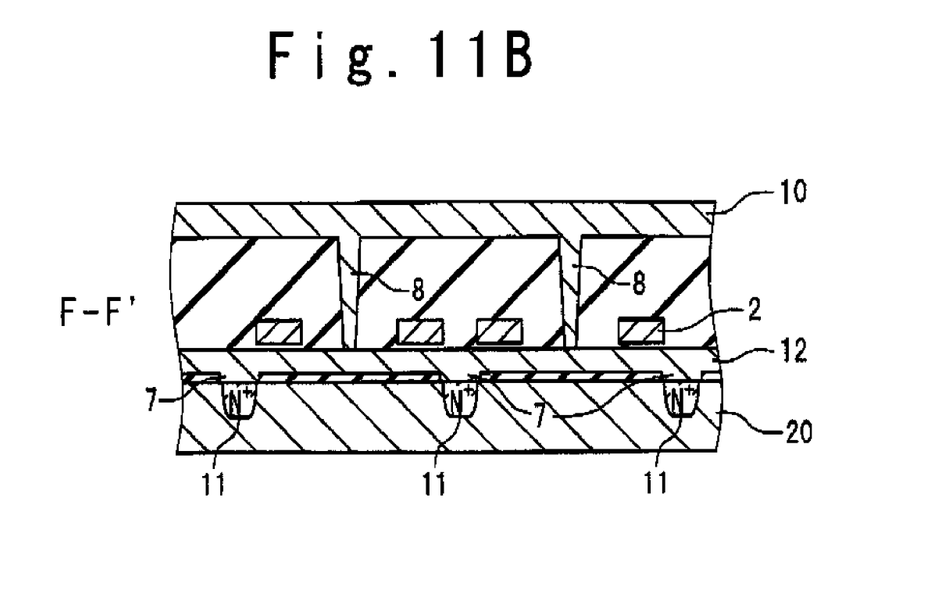
FIG. 11B is a sectional views showing a section structure of the NOR type flash memory according to the embodiment of the present invention along the line F-F' shown in FIG. 10.

The section structure of the NOR type flash memory 1 will be described below. FIGS. 11A and 11B are sectional views showing the section structure of the NOR type flash memory 1 in this embodiment. FIG. 11A shows the section of the flash memory 1 along the line E-E' in FIG. 10. Also, FIG. 11B shows the section of the flash memory 1 along the line F-F' in FIG. 10. Referring to FIG. 11A, the digit line diffusion regions 9 and the source line diffusion regions 11 are formed in a semiconductor substrate 20, the floating gates 5 are formed on the substrate 20 through an interlayer insulating film (tunnel oxide film). The control gate 2 is formed on the floating gate 5 through an interlayer insulating film (intergate oxide film). Also, as shown in FIG. 11A, the digit line 3 formed in the upper layer than the control gate 2 is connected to the digit line diffusion region 9 by the contact 4. Referring to FIG. 11B, the source diffusion region 11 is configured in the substrate 20. Here, the source diffusion region 11 shown in FIG. 11A and the source diffusion region 11 shown in FIG. 11B are electrically connected. Specifically, each source diffusion region 11 is configured by the diffusion region chat is straightly formed in the row direction shown in FIG. 10.

As mentioned above, the conductive section 12 shown in FIG. 11B is formed in the same layer as the floating gate 5 to overlap with the power supply line 10. This conductive section 12 is formed by using a dedicated mask (hereafter, referred to as a source portion floating gate mask) and implanting the impurity into a predetermined region. In short, the conductive section 12 is formed to extend over the control gates 2 below the power supply line 10. Therefore, at a step (new step) of implanting the impurity to form the source line diffusion regions 11 under the floating gate, the region into which the impurity is implanted can be limited to the source line. Therefore, the NOR type flash memory 1 can be formed without any enlargement of the margin between the source line diffusion region 11 and the digit line diffusion region 9. Also, the connection between the conductive section 12 and the source line diffusion region 11 is established through the source portion contact 7, and the source portion contact 7 is formed by removing the insulating film when the source line diffusion region is formed.

The NOR type flash memory 1 in this embodiment can contain the contact 8 formed on the same line extending in the row direction as the contacts 4 since containing the conductive section 12 formed in the same layer as the floating gate 5. Therefore, the power supply voltage can be supplied without bending of the control gate 2, unlike the conventional NOR type flash memory 100. Thus, it is possible to form the power supply line 10 and the digit line 3 in the same width. Therefore, when the digit line is formed, the optical diffraction to the adjacent digit line 3 caused by the power supply line 10 can be reduced, thereby suppressing the variation in the width of the formed diffusion region.

Figure 12:
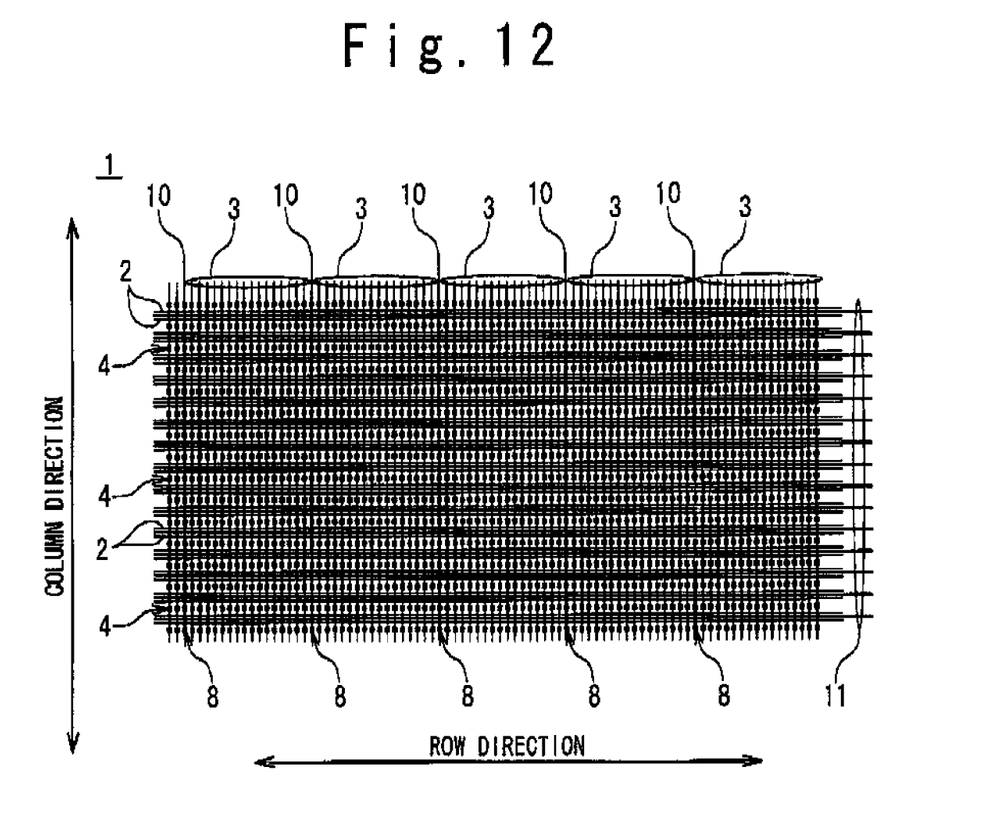
FIG. 12 is a diagram showing a layout pattern of the memory cells in the NOR type flash memory according to the embodiment of the present invention.

FIG. 12 is a diagram schematically showing the configuration of the NOR type flash memory 1 in this embodiment. With reference to FIG. 12, in the NOR type flash memory 1, the power supply line 10 and the digit lines 3 are equal in width to each other. Thus, it is possible to reduce the chip area in the row direction.

Also, the NOR type flash memory 1 in this embodiment is not required to consider the separation property from the adjacent digit diffusion region, at the step of implanting the impurity to form the source line diffusion region 11. In short, in relation to the step of forming the floating gate 5, the conductive section 12 is formed, and the supply of the power supply voltage to the source line diffusion region 11 is carried out through the conductive section 12. Thus, the implantation of the impurity into the source line diffusion region can be limited to the region corresponding to the source portion contact 7. Therefore, the margin enlargement can be avoided.

In association with the demand for the larger capacity of a memory, the nonvolatile semiconductor memory having a NOR type memory cells is also required to reduce its cost and save the power consumption. For these purpose, the miniaturization of the memory cell is expected to be further advanced in future. In the present invention, in order to suppress the margin between the source line diffusion region and the digit line diffusion region even in the miniaturization, the application of the power supply voltage to the source diffusion region through the contact is carried out by using the conductive section formed in the same layer as a floating gate. Thus, the implantation of impurity can be limited to the source contact portion, and the interval between the source line diffusion region and the digit line diffusion region can be made uniform.

The contact 8 for the connection between the power supply line pattern 10 and the conductive section 12 is formed on the same line as the contacts 4. For this reason, the contact 8 having the size similar to the contact 4 can be formed without requiring the margin for the contact 216 shown in FIG. 6. Since the size of the contact 8 is made similar to the contact 4, the width of the power supply line pattern 10 can be made thinner compared with the conventional example.

Moreover, as compared with the distance between the power supply line pattern 10 and the source line diffusion region, the distance between the conductive section 12 and the source line diffusion region is short. Therefore, the contact for the connection between the conductive section 12 and the source line diffusion region can be made smaller than the conventional contact 216.

According to the present invention, it is possible to suppress the variation in the characteristics such as a write time, an erasure time, a threshold in read, and a breakdown voltage, of the memory cell. Also, according to the present invention, it is possible to reduce the chip area. Specifically, the width of the power supply line pattern 10 does not need to be reduced, and the bending of the word line is also not required. Thus, it is possible to reduce the size in the column direction and the row direction. Moreover, according to the present invention, the semiconductor memory device can be manufactured without any execution of the optical compensation when the reticle is formed.

What is claimed is:

1. A semiconductor memory device comprising:
    a plurality of word lines arranged above a semiconductor substrate to extend in a row direction;
    a plurality of digit lines arranged above said semiconductor substrate to extend in a column direction orthogonal to said row direction;
    a power supply line arranged in parallel to said plurality of digit lines; and
    a plurality of memory cells formed on said semiconductor substrate at intersections of said plurality of word lines and said plurality of digit lines, each of said plurality of memory cells having a drain region and a source region;
    a linear conductive section arranged under said power supply line,
    wherein said power supply line is connected with said linear conductive section which is connected with said source regions of said plurality of memory cells,
    said drain regions of each of columns of said plurality of memory cells are connected with one of said plurality of digit lines, and
    said plurality of word lines function as gates of said plurality of memory cells.

2. The semiconductor memory device according to claim 1, wherein said plurality of digit lines and said power supply line are formed in a first wiring layer.

3. The semiconductor memory device according to claim 1, wherein said plurality of word lines are formed in a second wiring layer under said first wiring layer.

4. The semiconductor memory device according to claim 1, wherein each of said plurality of memory cells has a control gate and a floating gate, and
    said linear conductive section is formed on said semiconductor substrate through a first insulating film in a same third wiring layer as said floating gate.

5. The semiconductor memory device according to claim 1, further comprising:
    a first contact configured to connect said power supply line with said linear conductive section which is connected with said source regions of said plurality of memory cells; and
    a second contact provided for every adjacent two of said plurality of memory cells in said column direction such that said drains regions of each of columns of said plurality of memory cells are connected with one of said plurality of digit lines,
    wherein a row of said second contacts and said first contact are arranged on a same line.

6. The semiconductor memory device according to claim 5, further comprising:
    a third contact provided for every two rows of said source regions of said plurality of memory cells to connect said linear conductive section with the two rows of said source regions of said plurality of memory cells.

7. The semiconductor memory device according to claim 6, wherein said third contact is arranged on a side opposite to said first contact with respect to one of said plurality of word line.

8. The semiconductor memory device according to claim 4, further comprising:
    a first contact configured to connect said power supply line with said linear conductive section which is connected with said source regions of said plurality of memory cells; and
    a second contact provided for every adjacent two of said plurality of memory cells in said column direction such that said drains regions of each of columns of said plurality of memory cells are connected with one of said plurality of digit lines,
    wherein a row of said second contacts and said first contact are arranged on a same line.

9. A semiconductor memory device comprising:
    a plurality of memory cells, each of which has a control gate and a floating gate;
    a plurality of digit lines arranged above said plurality of memory cells to extend in a first direction, wherein each of said plurality of digit lines supplies a digit voltage to a column of said plurality of memory cells through digit line contacts;
    a power supply line arranged in parallel to said plurality of digit lines; and
    a conductive section formed in a same wiring layer as said floating gate to supply a power supply voltage from said power supply line to power supply terminals of said plurality of memory cells through power supply line contacts.

10. The semiconductor memory device according to claim 9, wherein each row of said digit line contacts and one of said power supply line contacts are formed on a same line.

11. The semiconductor memory device according to claim 10, wherein said conductive section is formed under said power supply line, and comprises:
    a linear conductive section arranged to extend in said first direction; and
    a connection contact connecting said linear conductive section with said power supply terminals of said plurality of memory cells, and
    said power supply line contact connects said power supply line and said linear conductive section.

12. The semiconductor memory device according to claim 9, further comprising:
    a semiconductor substrate;
    an insulating film formed on said substrate; and
    an intergate insulating film formed between said floating gate and said control gate,
    wherein each of said plurality of memory cells has first and second diffusion regions formed in said semiconductor substrate, said first diffusion region functions as said power supply terminal,
    said plurality of digit lines and said power supply line are arranged in a same wiring layer to extend in said first direction,
    said plurality of control gates are formed as a plurality of word lines extending in a second direction orthogonal to said first direction,
    each of said digit line contacts connects a corresponding one of said plurality of digit lines and said second diffusion regions of corresponding one of columns of said plurality of memory cells, said conductive section comprises:

a linear conductive section formed in parallel to said power supply line; and a connection contact formed to connect said linear conductive section and said first diffusion regions of said plurality of memory cells, and said power supply line contact is formed to connect said power supply line and said linear conductive section.

13. The semiconductor memory device according to claim 12, wherein a part of said plurality of digit contacts and said power supply line contact are formed on a same line.

14. A semiconductor memory device comprising:

two word lines arranged above a semiconductor substrate to extend in a row direction in parallel;

two digit lines arranged above said semiconductor substrate to extend in a column direction orthogonal to said row direction in parallel;

two diffusion lines arranged under said two digit lines to extend in said row direction;

a power supply line arranged in parallel to said two digit lines;

a linear conductive section arranged under said power supply line; and first, second and third contacts arranged on a line which is parallel to said word lines, wherein said first and second contact are connected said diffusion line and said digit line, and said third contact is connected said power supply line and said linear conductive section.

* * * * *